(12) United States Patent
Haworth

(10) Patent No.: US 6,269,959 B1
(45) Date of Patent: Aug. 7, 2001

(54) RACK MOUNTING BRACKET AND APPARATUS AND METHOD FOR MOUNTING A RACK MOUNTABLE UNIT IN A RACK

(75) Inventor: Stephen P Haworth, Amersham (GB)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/326,919

(22) Filed: Jun. 7, 1999

(51) Int. Cl.$^7$ ........................................................ A47F 5/00
(52) U.S. Cl. ...................... 211/26; 211/189; 248/222.52; 361/829
(58) Field of Search ............................ 211/26, 189, 182; 248/309.1, 222.52, 300; 361/829

(56) References Cited

U.S. PATENT DOCUMENTS

| | | | |
|---|---|---|---|
| 4,081,979 | 4/1978 | Dawson . | |
| 4,212,445 | * 7/1980 | Hagen | ......................... 248/222.52 X |
| 4,697,774 | * 10/1987 | Sarton et al. . | |
| 5,312,005 | * 5/1994 | Odell | ..................................... 211/189 |
| 5,358,205 | * 10/1994 | Starkey et al. . | |
| 5,529,273 | * 6/1996 | Benthin | ....................... 248/222.52 X |
| 5,709,359 | * 1/1998 | Riley | ................................. 248/300 X |
| 5,890,602 | * 4/1999 | Schmitt | .............................. 211/26 X |
| 5,971,507 | * 10/1999 | Peroni | ................................ 211/26 X |
| 6,021,909 | * 2/2000 | Tang et al. | ......................... 211/26 X |

FOREIGN PATENT DOCUMENTS 196 43 283   4/1998  (DE) .
  930671   2/1948  (FR) .

* cited by examiner

*Primary Examiner*—Robert W. Gibson, Jr.
(74) *Attorney, Agent, or Firm*—Conley, Rose & Tayon, PC; B. Noël Kivlin

(57) ABSTRACT

A mounting bracket forms a rack mount for a rack-mountable unit. The mounting bracket includes a planar body portion and a latching pivot for insertion into an aperture in a side wall of the rack-mountable unit. A head on the latching pivot is arranged to be insertable into a correspondingly shaped aperture, with securing of the mounting bracket to the rack-mountable unit being achieved by rotating the rack mount with respect to the rack-mountable unit with the latching pivot fully inserted into the aperture. On rotation, the head of the latching pivot is arranged to engage behind the side wall of the rack-mountable unit to secure the mounting bracket to the rack-mountable unit. Detent flanges on the mounting bracket prevent over-rotation of the bracket. A flange is provided for attaching the mounting bracket to the rack. Bumps or other projections on the body portion urge the body portion away from the side of the rack mountable unit on rotation of the mounting bracket, whereby the head of the latching pivot engages securely behind the side wall of the rack-mountable unit.

45 Claims, 6 Drawing Sheets

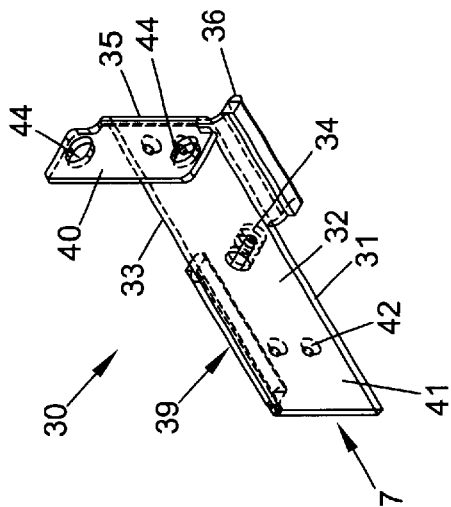
FIG. 4A
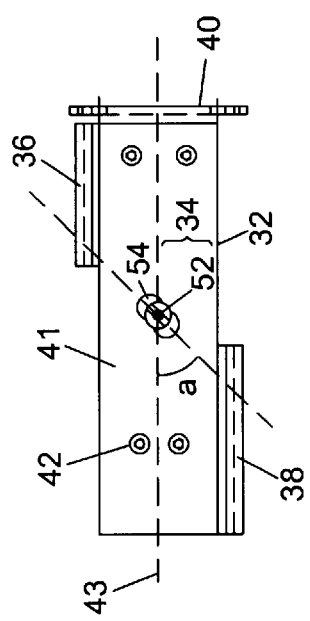
FIG. 4B
FIG. 4C
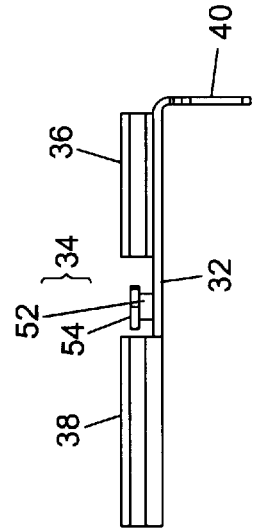
FIG. 4D
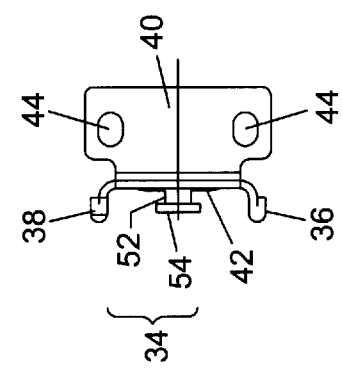
FIG. 4E

RACK MOUNTING BRACKET AND APPARATUS AND METHOD FOR MOUNTING A RACK MOUNTABLE UNIT IN A RACK

BACKGROUND OF THE INVENTION

The present invention relates to mounting equipment in a rack. In particular, the invention relates to a mounting bracket for mounting a rack-mountable unit in a rack, to electrical equipment for mounting in a rack and to a method of mounting electrical equipment in a rack.

It is well known to provide racking systems for mounting electrical equipment in a rack structure. Typically, the rack structure includes vertical bars having holes to which rack-mountable units can be mounted by means of screws, clips, etc. Typically, a unit for mounting in the rack comprises a housing. Attached to or forming an integral part of the housing, a mounting element will include a flange having holes for co-operating with corresponding holes of a rack bar for receiving fasteners or other fixing means that pass through the holes in the flange and the rack bar for securing the unit to the rack structure. If the mounting element is integral to the rack-mountable unit, then it will typically only be suitable for one type of racking. Accordingly, it is usual for such a mounting element to be in the form of a bracket that is attached to the unit by means of screws.

However, the use of screws to secure the mounting bracket to the unit to be supported includes a number of disadvantages. In the first place, it is necessary to supply the screws in a fixing kit. This increases the parts costs way beyond the individual value of the screws. Also, the screws can easily be omitted from the fixing kit and/or be lost. Also, when a mounting bracket is attached to a rack mountable unit, it is necessary to provide the unit with a nut or threaded element for receiving and securing the screw. Also, where a screw mounting is needed, it is typically the case that the screw will penetrate the housing of the unit. If supplied screws are used, this would typically not cause any problems. However, if the screws are lost, and an installer decides to use a longer screw, it is perfectly possible that a screw may then interfere with an electrical component within the housing, and cause an electrical failure and/or be dangerous to the installer and/or users of the rack mountable units and/or the racking system.

The current trend of providing slim form factors for rack mountable equipment (i.e., units that are thin), puts more and more demands on the designers of rack mountable units regarding the location and cooling of components within the rack-mountable unit. Typically, with a slim unit, it is necessary to use as much as possible of the available width within the unit. Accordingly, this leaves very little space at the edges of the unit, and increases the potential dangers from incorrect screws being used for attaching a mounting bracket to the rack-mountable unit.

Accordingly, an aim of the present invention is to provide a mounting bracket for a rack-mountable unit and rack-mountable equipment that avoids the disadvantages of prior art. In particular, it is desired to provide an arrangement that is simple and easy to use, and requires a minimum of components.

SUMMARY OF THE INVENTION

Particular and preferred aspects of the invention are set out in the accompanying independent and dependent claims. Combinations of features from the dependent claims may be combined with features of the independent claims as appropriate and not merely as explicitly set out in the claims.

In accordance with one aspect of the invention, there is provided a mounting bracket for mounting a unit within a rack. The mounting bracket includes a body portion. A mounting portion on a first side of the body portion includes formations connectable to a rack. A latching pivot portion on a second side of the body portion is insertable into an aperture in a wall of the unit at a given relative orientation of the mounting bracket to the unit and engages behind the wall of the unit on relative rotation between the mounting bracket and the unit.

This latching pivot arrangement enables the attachment of the mounting bracket to the wall of the rack-mountable unit. As the latching pivot portion forms part of the mounting bracket, it can be configured to have a controlled length so that it does not interfere with components within the housing of the rack-mountable unit. Also, because it forms part of the mounting bracket, it cannot be lost. An embodiment of a mounting bracket according to the invention thus reduces the parts count of a fixing assembly and facilitates mounting of the rack-mountable units.

At least one detent portion can be provided for restricting rotation of the mounting bracket with respect to the unit. Preferably, two detent portions are provided that engage in stepped recesses in a side wall of the rack-mountable unit.

The mounting portion can be in the form of a flange with at least one hole for receiving a fastener. The fastener can be a screw, clip or other fixing means. The mounting portion can be formed integrally to the body portion.

The latching pivot portion can be thought of as providing a bayonet-like fastening. The latching pivot portion can be formed with a shank and a head. The shank can be longer than the thickness of the wall. The body portion can be formed with raised portions that are operable, on rotation of the mounting bracket, to urge the body portion away from the wall of the unit causing the head of the latching pivot portion to latch securely behind the side wall of the rack-mountable unit.

The head can have at least one dimension in a plane perpendicular to an axis of the shank different from a dimension in another direction in the plane. For example, the head could be polygonal. Alternatively, it could be obround. By providing a correspondingly shaped aperture in the side wall of the rack-mountable unit, on rotation of the mounting bracket the head will latch behind the side wall of the rack mountable unit. The relative orientations of the aperture and the head are arranged such that when the body portion of the mounting bracket is offered up to the side wall of the rack-mountable unit, the head of the latchable pivot, or mounting pin, fits within the aperture in the side wall, and, on rotation of the mounting bracket about the axis of the mounting pin, the head engages behind the side wall of the rack-mountable unit. Where, for example, the head is obround, the longitudinal axis of the obround can be oriented at an angle to the longitudinal axis of the body portion (e.g. 45°) for insertion through an obround aperture arranged parallel or perpendicular to the longitudinal axis of the side wall. In this way, the mounting bracket can be oriented at an angle to the rack-mountable unit (e.g., 45°) for insertion of the latchable pivot in the aperture and then be rotated to align the mounting bracket with the unit, securing the mounting bracket to the unit.

The latching pivot portion can be fastened to the body portion, for example using a fastener such as a screw. Alternatively, the latching pivot portion could be integral to the body portion. In a preferred embodiment, the body portion is substantially planar, with all portions of the mounting bracket with the exception of the latching pivot being formed by stamping and folding sheet metal.

In accordance with another aspect of the invention, there is provided a mounting bracket for mounting a unit within a rack. The mounting bracket includes a substantially planar body portion having a first and second sides, first and second edges and first and second ends. A mounting portion is provided on the first side of the body portion adjacent the first end thereof. A first detent portion is provided on the second side of the body portion adjacent the first edge and towards the first end thereof. A second detent portion is provided on the second side of the body portion adjacent the second edge and towards the second end thereof. A latching pivot portion is provided on the second side of the body portion at least substantially at the centre thereof, the latching pivot portion being configured to be inserted in a hole in a side wall of the unit and to engage behind the wall on rotation of the mounting bracket about the latching pivot portion.

The body portion can be formed from a plate, with the body portion is integral with the first and second detent portions. The detent portions can form flanges bent from the plate. The body portion can also be integral with the mounting portion, the mounting portion forming a flange with at least one hole for a fastener. Where the body portion is formed by stamping and folding a sheet metal, the latching pivot portion will typically be fastened to the body portion, for example by a fastener such as a screw. However, the latching pivot portion could be formed integral to the body portion if the mounting bracket is cast from metal or moulded from a plastics material, or example.

In accordance with a further aspect of the invention, there is provided electrical equipment including a rack-mountable unit having first and second end walls, each end wall having at least one shaped aperture, and two mounting brackets. The mounting brackets can be as set out above. The electrical equipment could further include first and second channel-shaped mounting brackets for supporting a rear portion of the electrical equipment within the rack, and could further include the rack itself.

In accordance with yet a further aspect of the invention there is provided a method of mounting a unit within a rack. The method includes attaching first and second mounting brackets to first and second sides of the unit. The attaching of the first and second mounting brackets includes, for each mounting bracket, inserting a pivot element of the mounting bracket within an aperture in a side wall of the unit with the bracket at a given orientation with respect to the bracket, rotating the bracket to cause a head of the pivot element to engage behind the side wall, and then securing each mounting bracket to the rack.

If the direction of rotation is different for each of the mounting brackets, then two identical mounting brackets can be used, and this further means that twisting moments will not release the mounting brackets from the rack-mounted unit. The amount of rotation for each bracket can limited by detent flanges of the mounting bracket. Also, during rotation, each mounting bracket is urged away from the side wall by protrusions on a surface of the mounting bracket.

The method of mounting a unit within a rack can further comprise, prior to securing the mounting brackets to the rack, attaching each of first and second slide-shaped brackets to a rear support of the rack and sliding a rear of the rack-mountable unit into the slide-shaped brackets.

BRIEF DESCRIPTION OF THE DRAWINGS

Exemplary embodiments of the present invention will be described hereinafter, by way of example only, with reference to the accompanying drawings in which like reference signs relate to like elements and in which:

FIGS. 4A–4E are diagrams showing a mounting bracket in more detail;

DESCRIPTION OF THE PREFERRED EMBODIMENTS

Figure 1:
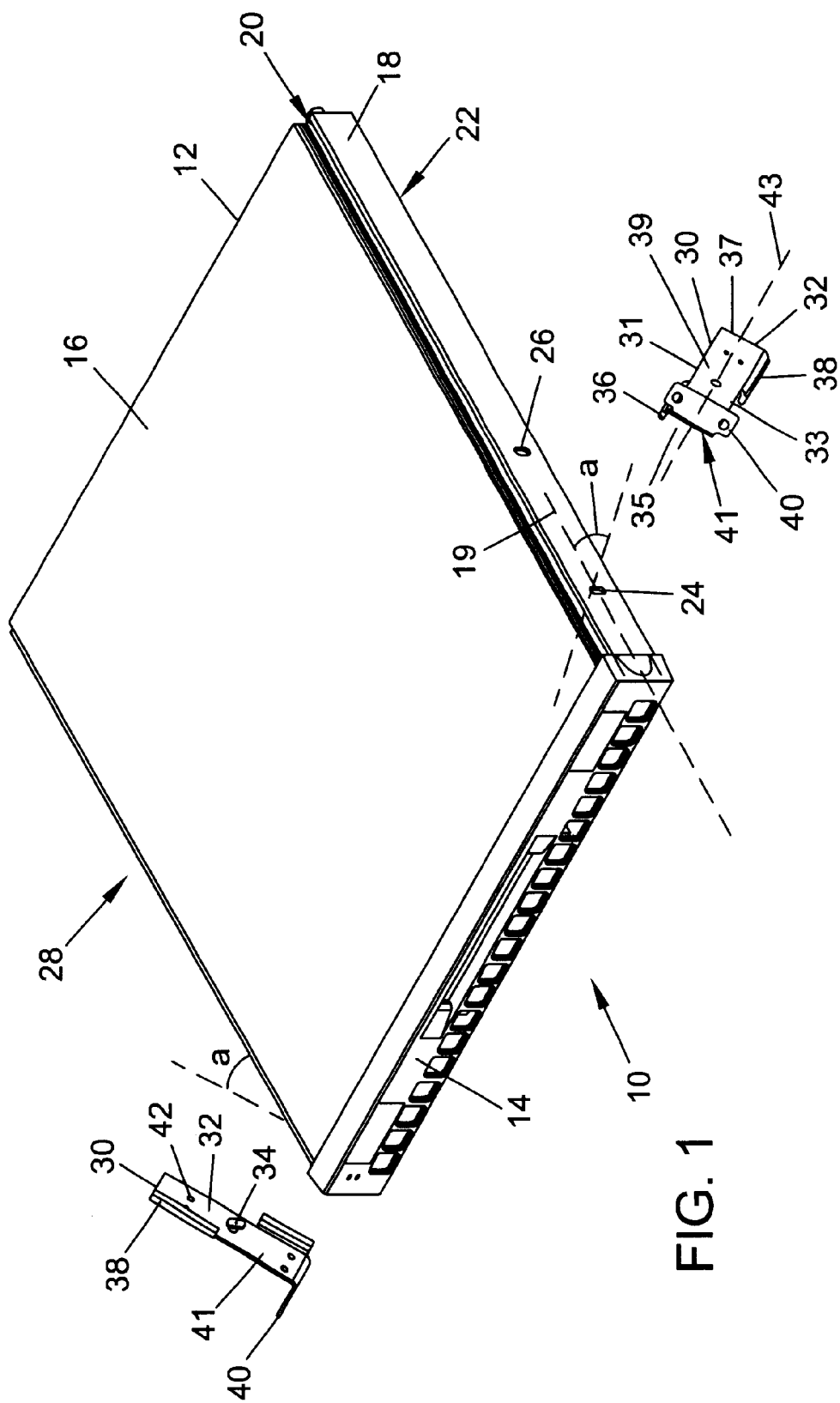
FIG. 1 is a perspective view of a rack-mountable unit with mounting brackets in accordance with an embodiment of the invention.

FIG. 1 is a perspective representation of a rack-mountable unit 10. This includes a housing 12 and a front plate 14. The housing 12 includes an upper wall 16, a lower wall (not shown), a rear wall (not shown), a first side wall 18 formed with a stepped recess or rebated portion 20 adjacent to the upper wall 16, and a second stepped recess, or rebated portion 22 adjacent to the lower wall. Towards the front of the side wall 18, first and second mounting apertures 24 and 26 are provided in the side wall 18. In the present example the apertures are obround in shape. However, other shapes may be used as will be explained later. A second side wall 28 (not shown) is configured in the same manner as the side wall 18, with stepped recess portions (not shown) adjacent the upper and lower walls and also with corresponding obround mounting apertures corresponding to the apertures 24 and 26 shown in FIG. 1.

Such a rack-mountable unit can have, for example, a height of only about 44 mm (1.75 inches) and a width of approximately 445 mm (17.5 inches) for mounting in racking have a 480 mm (19 inch) spacing. The requirement to provide complex high performance electronic equipment within such a slim form factor, causes considerable challenges with regard to the mounting of the components within the housing 12 in order to provide the necessary component isolation and component cooling. As a result, it is desirable to be able to use all of the available width within the housing. Accordingly, in accordance with an embodiment of the invention, mounting brackets are used that do not need to be screwed to the side walls of the housing, avoiding any danger of screws interfering with the components within the housing and avoiding the need to provide threaded parts for receiving such screws.

First and second mounting brackets 30 are shown in FIG. 1. Each mounting bracket co-operates with one of the pair of mounting positions in each of the side walls 18 and 28. Each mounting bracket 30 forms an example of a rack mount in accordance with the present invention. Each mounting bracket 30 comprises a planar portion 32. The planar portion 32 has a first edge 31, a second edge 33, a first end 35 and a second end 37. The planar portion has a first surface 39 and a second surface 41. As shown in FIG. 1, the planar portion is a plane made from sheet metal. However, the planar portion need not be a complete plane, but could be formed with a grid or other structure and/or be formed with various holes.

A first flange 36, which forms a first detent, is formed on the first edge adjacent the first end of the planar portion and extends away from the second side 41 of the planar portion. A second flange 38, which forms a second detent, is formed at the second edge 33 of the planar portion adjacent the second end 37 thereof, and extends away from the second side 41 of the planar portion. A further flange 40, which forms a mounting flange, extends away from the first side 39 of the planar portion 37 (i.e., extends generally in the opposite direction to the first and second flanges 36 and 38). A mounting pin 34 forming a latching pivot also extends from the second side 41 of the planar portion, generally adjacent the middle thereof. The mounting pin 34 is provided with an obround head for insertion within the obround mounting aperture in either side 18/28 of the rack-mountable unit 10. The head of the mounting pin is arranged such that the head may be inserted through the aperture when a longitudinal axis 43 of the mounting bracket is at an angle a (e.g., approximately 45°) to a longitudinal axis 19 of the side wall 18. The head of the pin 34 is configured to lie behind the inside surface of the side wall 18 such that, with rotation of the mounting bracket about the pin 34, which thus forms a pivot, the extremities of the obround head engage, or latch, behind the side wall 18. The mounting brackets shown in the bottom right of FIG. 1 would be inserted into the obround hole at approximately the angle a (e.g., approximately 45 degrees), and then rotated in a counter-clockwise direction (as shown in the Figure) to close the angle a. The first and second detent flanges 36 and 38 then engage within the respective stepped recesses 20 and 22 to locate the flange in position.

The relative orientations of the aperture and the head of the mounting pin 34 are arranged such that when the body portion of the mounting bracket is offered up to the side wall of the rack-mountable unit, the head of the mounting pin 34 can be inserted through one of the apertures 24 or 26 in the side wall 18, and, on rotation of the mounting bracket about the axis of the mounting pin, the head engages behind the side wall of the rack-mountable unit. For example, in the present instance the head is obround with the longitudinal axis of the obround oriented at an angle of about 45° to the longitudinal axis of the body portion and the longitudinal axis of the obround aperture in the side wall 18 is arranged perpendicular to the longitudinal axis of the side wall. In this way, the mounting bracket can be oriented at an angle to the rackmountable unit (about 45°) for insertion of the latchable pivot in the aperture and then be rotated to align the mounting bracket with the unit, securing the mounting bracket to the unit. It will be appreciated that other combinations of shaped and relative orientations can be employed while still providing the insertion, rotation and latching action of the mounting bracket with respect to the rack-mountable unit.

For reasons of symmetry and ease of operation, it is desirable to arrange for the relative orientations the head of the mounting pin and the aperture in the side wall to be about 45°. This facilitates the use of identical mounting brackets for each side of the rack-mountable unit with the mounting brackets being able to be offered up to either side at the same angle (45°) with respect to the rack-mountable unit.

In order to ensure a close and secure fit, bumps 42 (as shown for the bracket at the top left of FIG. 1) are provided on the second side 41 of the planar portion 32. These bumps 42 serve to urge the mounting bracket outward from the outer surface of the side wall 18/28 of the unit 10 so that the head of the pin 34 is pressed against the inside surface of the side wall 18/28. In such a manner, the mounting bracket can be secured to a side wall 18/28 of the unit 10. It will be noted that both of the mounting brackets 30 shown in FIG. 1 are identical. Thus, as seen in FIG. 1, the mounting brackets shown at the top left of that Figure is inserted into the aperture corresponding to aperture 24 in the side wall 28 and is then rotated clockwise (as shown in that Figure) to align the longitudinal axis of the mounting bracket and the side wall 28 with the first and second flanges 36 and 38 locating within the stepped recesses at the top and bottom of the side wall 28.

Figure 2:
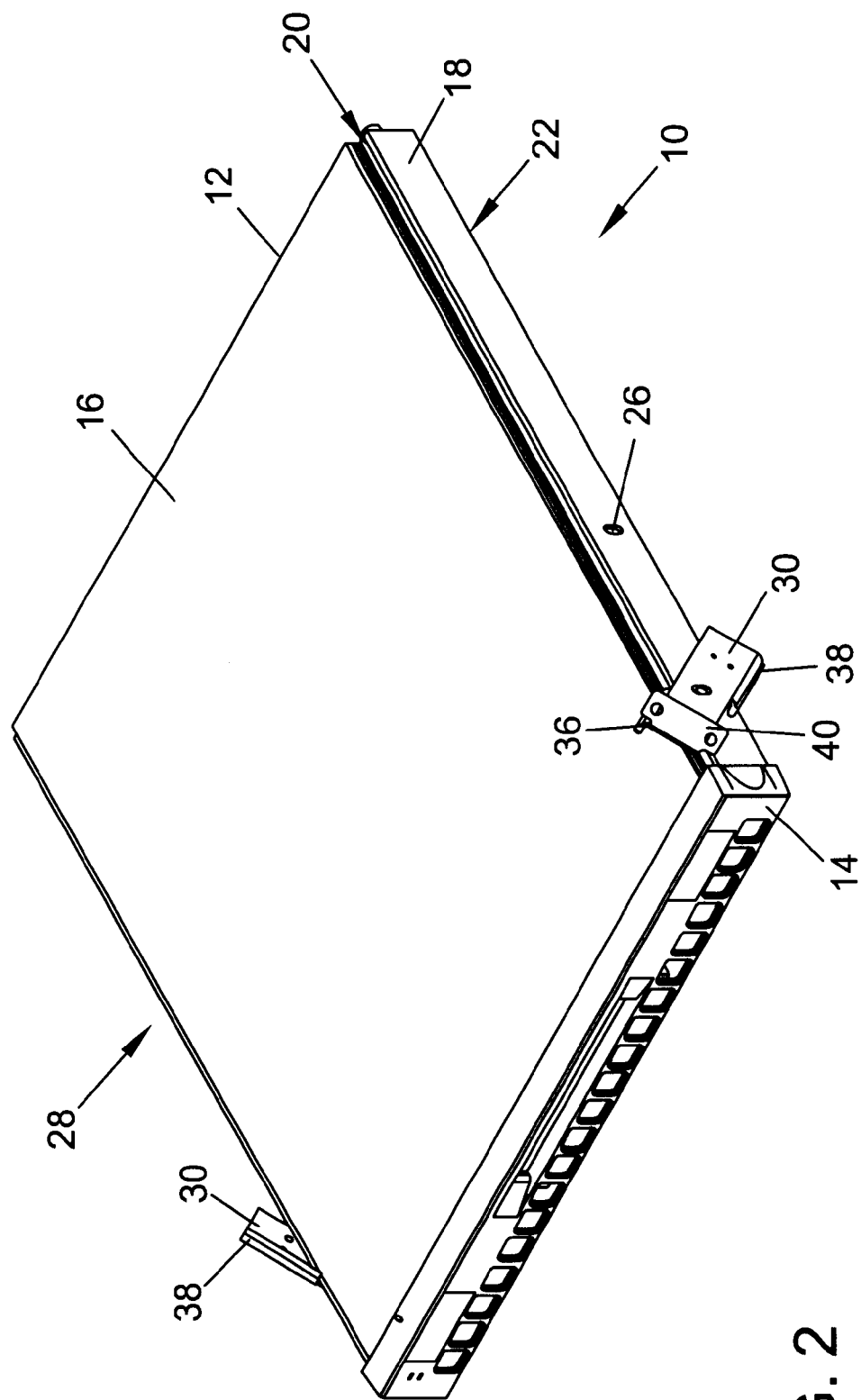
FIG. 2 is a perspective view of the rack-mountable unit for explaining the attachment of the mounting brackets to that unit.

The process of attaching the mounting brackets is illustrated with reference to FIGS. 2 and 3. In particular, FIG. 2 shows both of the mounting brackets in a position where their respective mounting pins are located in respective mounting apertures with the obround head of the mounting pin aligned with the orientation of the obround aperture. As shown in FIG. 2, in this position the mounting brackets 30 are at an angle to the side wall 18/28 of the rack-mountable unit 10.

Figure 3:
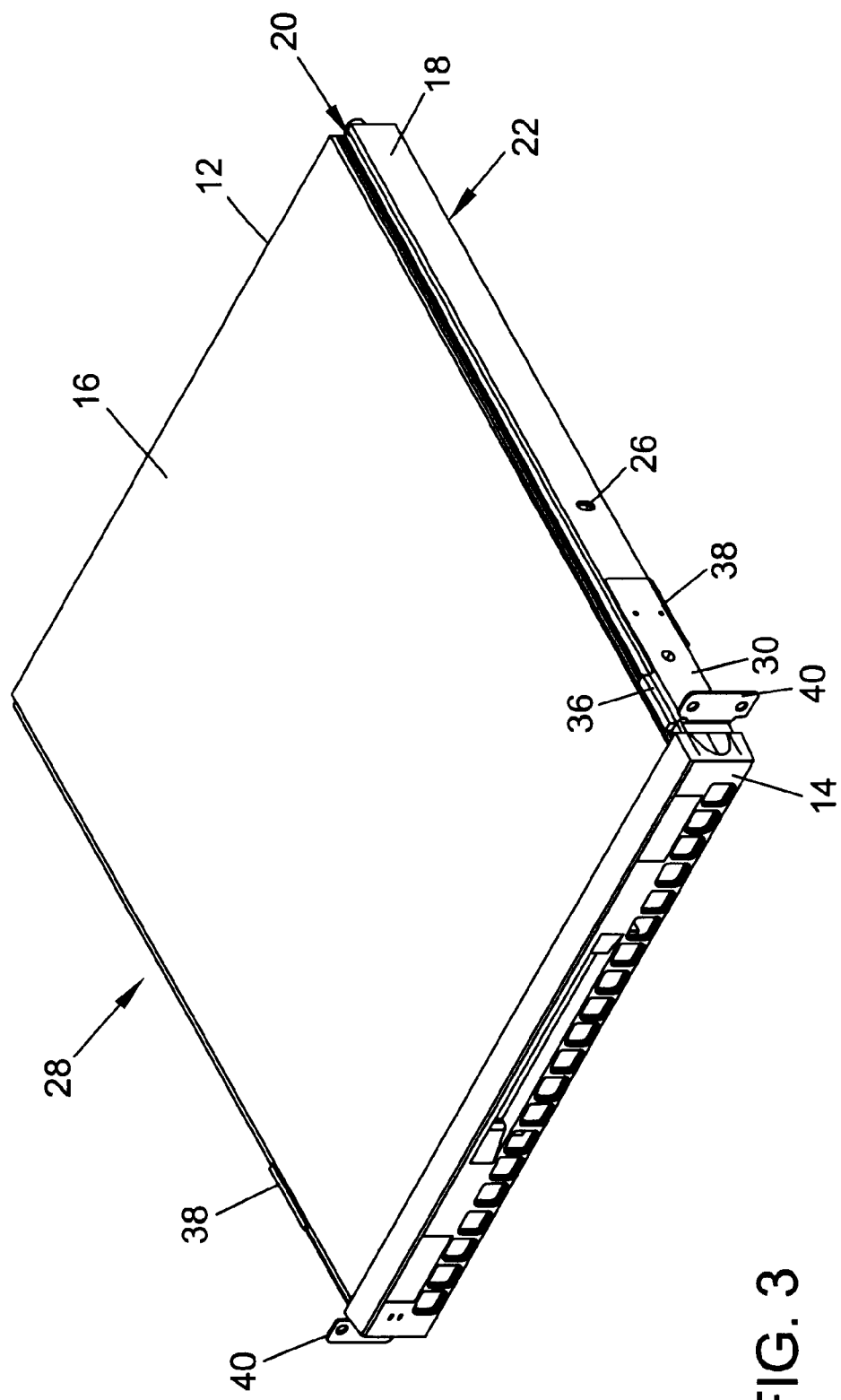
FIG. 3 illustrates the mounting brackets attached to the rack-mountable unit.
Figure 5A:
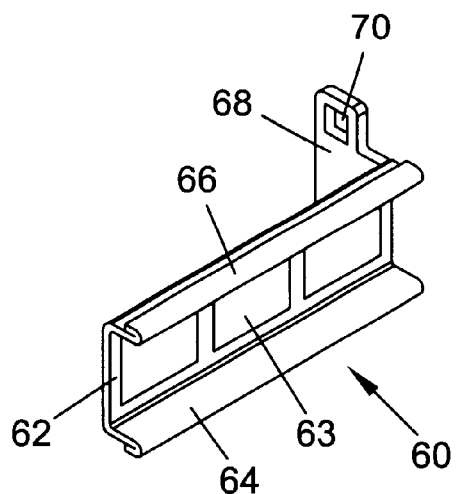
FIG. 5 illustrates a further mounting bracket for use with a mounting bracket in accordance with the invention.
Figure 5B:
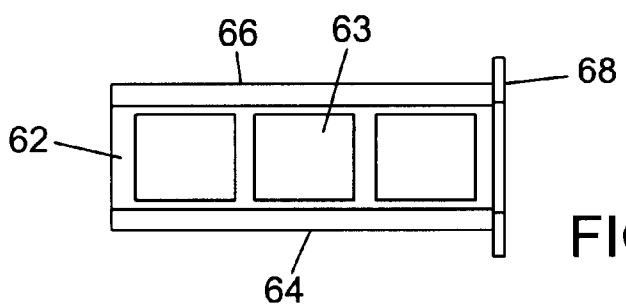
Figure 5C:
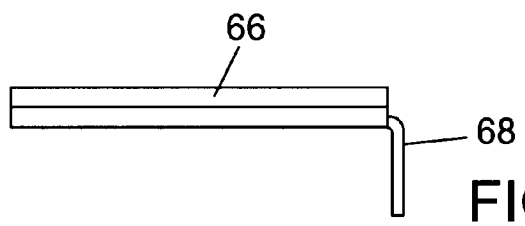
Figure 5D:
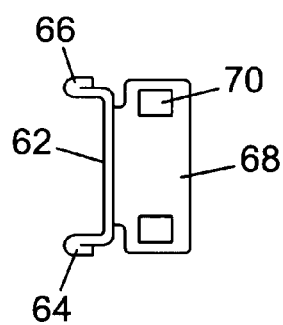

FIG. 3 shows the next stage in attachment of the mounting brackets, wherein the mounting brackets have each been rotated in the appropriate direction to bring the first and second detent flanges 36 and 38 into co-operation with respective stepped recesses at the upper and lower edges of the side walls 18 and 28. As mentioned above, the bumps which project from the second surface of each of the mounting brackets serve to urge the mounting brackets away from the respective side walls and to ensure a good friction fit between the head of the mounting pins and the inside surface of the side walls.

As the mounting brackets are rotated in effectively opposite directions at either side of the rack-mountable unit, the mounting bracket enables resistance to twisting of the unit without having any permanent fixing means, and also enables identical mounting brackets to be used on both sides of the rack-mountable unit.

Although, in the present example, a particular shape of the head of the mounting pin 34 has been described, namely an obround shape, it will be appreciated that the head could have any other form which can provide a key-lock or bayonet-latching arrangement. Thus, for example, the head could be oval, rectangular, or any other shape having one dimension larger than another. Also, it would be appreciated that the head need not be elongate, but could be triangular, square, hexagonal, L-shaped, or any other shape which could provide such a key and/or bayonet type latching arrangement.

In a typical embodiment, the planar portion 32 has a length of approximately 100 mm and a width of approximately 30 mm, with each of the detent flanges 36 and 38 having an extent of approximately 10 mm, and the mounting flange 40 having an extent of approximately 22 mm. The width of the central flat portion of each side wall 18, 28 is approximately 34 mm, with each of the stepped recesses 20, 22 having a width of approximately 8 mm. The mounting pin 34 is chosen to have a shank which is slightly longer than the thickness of the wall forming the side wall of the rack-mountable unit 10, the remaining slack between the planar portion 32 of the mounting bracket 30 and the head 54 of the pin 34 being taken up by the spacing of the planar portion from the side wall 18 caused by the bumps 42.

FIG. 4 illustrates the mounting bracket 30, which forms an embodiment of a mounting bracket in accordance with the invention, in more detail.

FIG. 4A is a perspective representation of the mounting bracket 30. It can be seen that the mounting bracket comprises a planar portion 32. A first detent flange 36 is formed at a first edge 31 of the planar portion 32 adjacent a first end 35 thereof. The end of the detent flange 36 is folded back on itself to form a Dutch bend in order to strengthen the detent flange 36. A second detent flange 38 is formed at a second edge 33 of the planar portion 32 adjacent a second end 37 thereof. The end of the detent flange 38 is also bent back to form a Dutch bend. The first and second detent flanges extend away from the second side 41 of the planar portion 32. A mounting flange 40 is formed at the first end 35 of the planar portion 32 and extends away from a first side 39 of the planar portion 32. First and second mounting holes 44 are provided in the mounting flange 40, for receiving fasteners or other fixings, (e.g., screws) for mounting the mounting brackets, when attached to the rack-mountable unit, to a rack. Bumps 42 project from the second surface of the planar portion 32 as described above. The location of the pivot/mounting pin 34 is generally represented at the centre of the planar portion 32 in FIG. 4A.

FIG. 4B illustrates a view of the second side 41 of the mounting bracket 30. This shows the head 54, and the shaft, or shank 52 of the mounting pin 34, the bumps 42, the first and second detent flanges 36 and 38 and the mounting flange 40. This shows, in particular, how the obround head 54 of the mounting pin 34 is oriented at an angle a (e.g., about 45°) to the longitudinal axis 43 of the planar portion 32.

FIG. 4C is an edge view of the first edge 31 of the mounting bracket 30. This shows, in particular, how the head 54 of the mounting pin 34 is wider than the shank, or shaft portion 52, thereof.

FIG. 4D shows a view of the first side 39 of the mounting bracket 30. This shows, in particular, the depressions 43 on the reverse side of the bumps 42, and a head 50 of a screw used to secure the mounting pin 34 to the planar portion 32. In order to ensure that the mounting pin does not swivel with respect to the planar portion 32, the mounting pin can be provided, at its end adjacent the planar portion 32, with a shaped configuration for co-operating with a correspondingly shaped configuration of the planar portion 32. Thus, for example, the end of the shank 52 of the pin 34 opposite to the head 54 could be provided with a square section key for co-operation with a square section recess (not shown) in the second surface 41 of the planar portion 32. Other co-operation configurations (for example a flange and a slot) could be provided.

FIG. 4E is an end view from the second end 37 of the planar portion 42. This view illustrates, in particular, the configuration of the head 54 and shank 52 of the pin 34, and the provision of the bumps 42, as well as the folded over end portions of the detent flanges 36 and 38. Also represented are the mounting apertures 44 in the mounting flange 40.

The mounting bracket 30 can be manufactured, for example, from mild steel and be stamped and folded from a single piece of metal. In the present embodiment, as illustrated above, the mounting/pivot pin 34 is screwed to the planar portion 32 of the mounting bracket 30. However, it could be attached in any other suitable manner, for example by braising or welding. It will also be appreciated that the mounting bracket could be manufactured from any other suitable material other than mild steel, and could be formed, for example, by casting or moulding a suitable material.

FIG. 5 illustrates a further mounting bracket 60, which does not form a mounting bracket in accordance with the invention, but could be used with a mounting bracket in accordance with the invention for mounting a rack-mountable component 10 in a rack. The further mounting bracket 60 includes a planar portion 62 with apertures 63 for lightness and economy of materials, first and second edge flanges 64 and 66 and a mounting flange 68. Formed in the mounting flange 68 are first and second mounting apertures 70. The further mounting bracket 60 can have similar dimensions to the mounting bracket 30 described with reference to FIG. 4. However, the further mounting bracket can facilitate sliding of the rack-mountable unit if it is somewhat longer, for example 150 mm. FIG. 5A is a perspective representation of the further mounting bracket 60, FIG. 5B is a view of a first side of the planar portion 62, FIG. 5C is a first edge view of the further mounting bracket 60 and FIG. 5D is an end view of the further mounting bracket 60.

Figure 6:
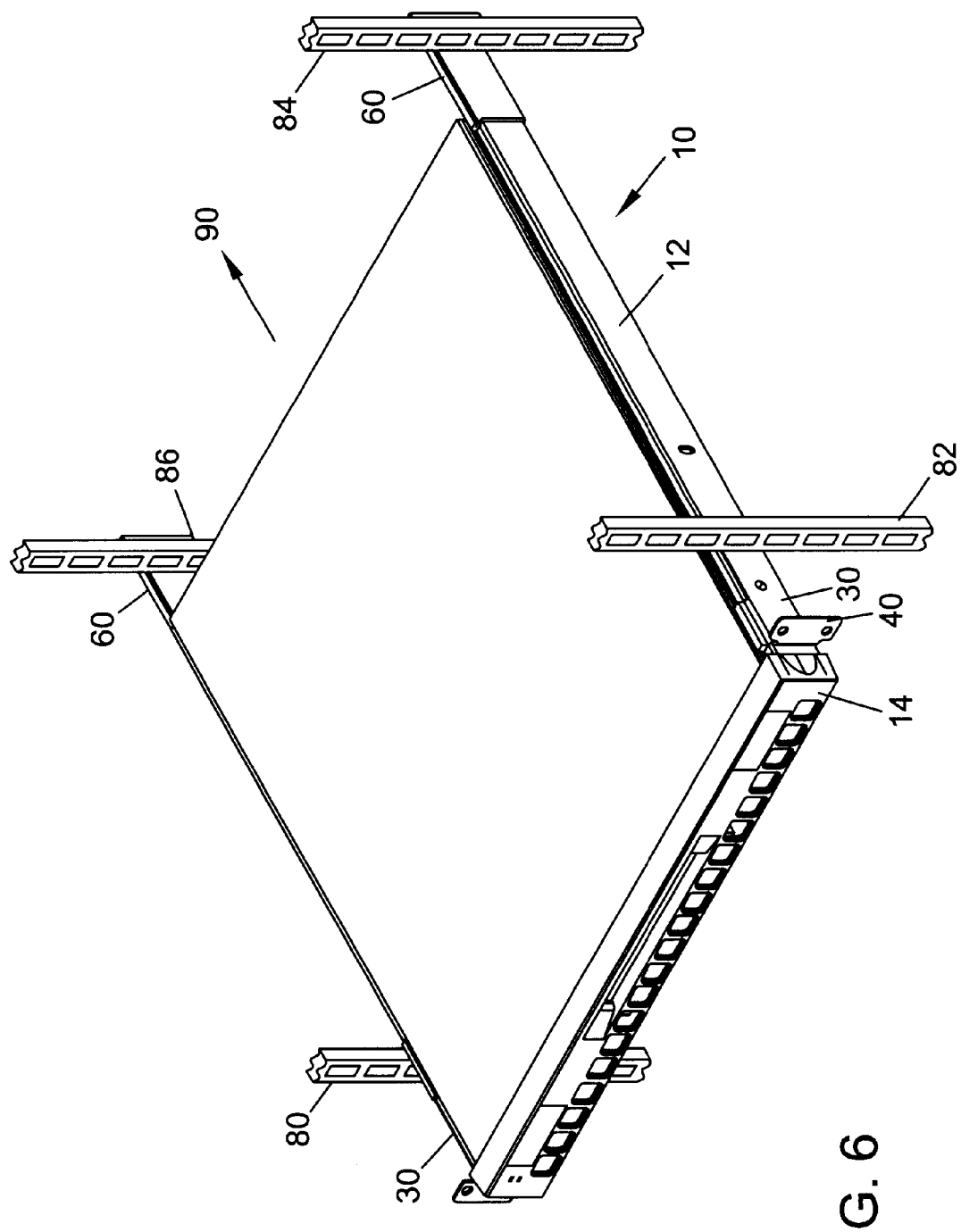
FIG. 6 is a schematic representation of the mounting of the rack-mountable unit using an embodiment of mounting brackets in accordance with the invention and further mounting brackets.

FIG. 6 is a schematic representation of the mounting of a rack-mountable unit within a racking system using a mounting bracket 30 in accordance with the present invention, and additionally the further, optional, mounting bracket 60. The procedure for mounting the rack-mountable unit within the racking system comprises attaching the mounting brackets 30 in the manner described with reference to FIGS. 1–3, and additionally attaching the further mounting brackets 60 to rear rack rails 84 and 86 by means of screws or other fasteners or fixing means. The rack-mountable unit 10 is then slid, in the direction 90, within the further mounts 60, and, when the mounting flanges 40 on the mounting brackets 30 reach the front rack elements 80 and 82, the mounting flanges 40 of the mounting brackets 30 are secured to the front rack elements 80 and 82 by means of screws and/or other fasteners or fixing means by co-operation of the mounting apertures 44 in the mounting flanges 40 and corresponding holes in the rack elements 80 and 82.

As suggested above, the further, optional mounting brackets 60 are not essential for an embodiment of the invention, but they do assist in resisting tilting of the rack-mountable unit within the racking system and are particularly useful where the rack-mountable unit is particularly heavy or subjected to a rear-loading. As the detent flanges 64 and 66 of the further mounting bracket 60 simply engage in the step recesses at the upper and lower edges of the side faces of the rack-mountable unit, they act as an effective guide for assisting in the correct location and for supporting the rack-mountable unit within the racking system, facilitating and assisting the mounting provided by the mounting brackets 30 of the present invention.

Thus, there has been described a mounting bracket that forms a rack mount for a rack-mountable unit. The mounting bracket includes a planar body portion and a latching pivot for insertion into an aperture in a side wall of the rack-mountable unit. A head on the latching pivot is arranged to be insertable into a correspondingly shaped aperture, with securing of the mounting bracket to the rack-mountable unit being achieved by rotating the rack mount with respect to the rack-mountable unit with the latching pivot fully inserted into the aperture. On rotation, the head of the latching pivot is arranged to engage behind the side wall of the rack-mountable unit to secure the mounting bracket to the rack-mountable unit. Detent flanges on the mounting bracket prevent over-rotation of the bracket. A flange is provided for attaching the mounting bracket to the rack. Bumps or other projections on the body portion urge the body portion away from the side of the rack mountable unit on rotation of the mounting bracket, whereby the head of the latching pivot engages securely behind the side wall of the rack-mountable unit.

It will be appreciated that a particular example, only, of the present invention has been described, and that many modifications, additions and/or substitutions may be made within the scope of the present invention.

For example, rather than bumps 42, one or more projections of another shape could be provided on the surface of the mounting bracket that abuts the side wall of the rack-mountable unit. For example, a straight or circumferentially extending projection of constant or increasing height could be provided. The aim of the projection(s), as discussed earlier, is to urge the planar portion of the bracket away from the surface of the side wall to secure the head behind the surface of the wall forming the side wall of the rack-mountable unit.

It will be appreciated that although particular embodiments of the invention have been described, many modifications/additions and/or substitutions may be made within the spirit and scope of the present invention as defined in the appended claims.

What is claimed is:

1. A mounting bracket for mounting a unit within a rack, the mounting bracket comprising a substantially planar body portion having a first and second sides, first and second edges and first and second ends, a mounting portion on the first side of the body portion adjacent the first end thereof, a first detent portion on the second side of the body portion adjacent the first edge and towards the first end thereof, a second detent portion on the second side of the body portion adjacent the second edge and towards the second end thereof and a latching pivot portion on the second side of the body portion at least substantially at the centre thereof, the latching pivot portion being configured to be inserted in a hole in a side wall of the unit and to engage behind the wall on rotation of the mounting bracket about the latching pivot portion.

2. The mounting bracket of claim 1, wherein the body portion is a plate.

3. The mounting bracket of claim 2, wherein the body portion is integral with the first and second detent portions.

4. The mounting bracket of claim 3, wherein the detent portions form flanges bent from the plate.

5. The mounting bracket of claim 1, wherein the body portion is integral with the mounting portion.

6. The mounting bracket of claim 5, wherein the mounting portion forms a flange with at least one aperture for a fastener.

7. The mounting bracket of claim 1, wherein the latching pivot portion comprises a shank and a head.

8. The mounting bracket of claim 7, wherein the shank is longer than the thickness of the surface.

9. The mounting bracket of claim 7, wherein the head is polygonal.

10. The mounting bracket of claim 7, wherein the head is obround.

11. The mounting bracket of claim 10, wherein a longitudinal axis of the obround is oriented at an angle to a longitudinal axis of the body portion.

12. The mounting bracket of claim 1, wherein the latching pivot portion is fastened to the body portion.

13. The mounting bracket of claim 12, wherein the fastening is by means of a fastener.

14. The mounting bracket of claim 13, wherein the fastener is a screw.

15. The mounting bracket of claim 1, wherein the latching pivot portion is integral to the body portion.

16. The mounting bracket of claim 1, wherein the body portion comprises raised portions on the second side.

17. Electrical equipment including a rack-mountable unit having first and second end walls, each end wall having at least one shaped aperture, and two mounting brackets, each mounting bracket comprising a body portion, a mounting portion on a first side of the body portion and provided with formations connectable to a rack, and a latching portion on a second side of the body portion that is insertable into an aperture in a wall of the unit at a given relative orientation of the mounting bracket to the unit and engages behind the wall of the unit on relative rotation between the mounting bracket and the unit.

18. The electrical equipment of claim 17, wherein each mounting bracket comprises a substantially planar body portion having a first and second sides, first and second edges and first and second ends, the mounting portion being provided on the first side of the body portion adjacent the first end thereof, a first detent portion on the second side of the body portion adjacent the first edge and towards the first end thereof, a second detent portion on the second side of the body portion adjacent the second edge and towards the second end thereof and the latching pivot portion, the latching pivot portion being provided on the second side of the planar part at least substantially at the centre thereof and being configured to be inserted in a hole in a side wall of the unit and to engage behind the wall on rotation of the mounting bracket about the latching pivot portion.

19. The electrical equipment of claim 17, further comprising first and second channel-shaped mounting brackets for supporting a rear portion of the electrical equipment within the rack.

20. The electrical equipment of claim 17, further comprising said rack.

21. A mounting bracket for mounting a unit to a rack, comprising:
   a body;
   a mount coupled to a first side of the body, the mount configured to couple to the rack;
   a pivot coupled to a second side of the body, wherein the pivot is insertable into an aperture in a wall of the unit when the body is oriented in a first position, and wherein a portion of the pivot is positioned behind the wall to inhibit removal of the pivot from the unit when the body is in a second position; and
   a detent coupled to the second side, the detent configured to engage a portion of the unit to limit a rotational range of the body relative to the unit.

22. The mounting bracket of claim 21, wherein the body further comprises a raised portion, the raised portion configured to engage the unit to form a tight engagement between the pivot and the wall when the body is in the second position.

23. The mounting bracket of claim 21, further comprising an aperture in the mount, the aperture configured to receive a fastener that couples the mounting bracket to the rack.

24. A mounting bracket for mounting a unit to a rack, comprising:
   a body;
   a mount coupled to a first side of the body, the mount comprising a flange having an aperture for receiving a fastener, and wherein the mount is coupled to the rack by the fastener; and
   a pivot coupled to a second side of the body, wherein the pivot is insertable into an aperture in a wall of the unit when the body is oriented in a first position, and wherein a portion of the pivot is positioned behind the wall to inhibit removal of the pivot from the unit when the body is in a second position.

25. The mounting bracket of claim 24, wherein the pivot provides bayonet fastening to the unit.

26. The mounting bracket of claim 24, wherein the pivot comprises a shank and a head.

27. The mounting bracket of claim 26, wherein the shank is longer than a thickness of the wall.

28. The mounting bracket of claim 26, wherein the head has a dimension in a plane perpendicular to an axis of the shank different from a dimension in another direction.

29. The mounting bracket of claim 28, wherein the head is polygonal.

30. The mounting bracket of claim 28, wherein the head is obround.

31. The mounting bracket of claim 30, wherein a longitudinal axis of the obround is orientated at an angle to a longitudinal axis of the body.

32. The mounting bracket of claim 24, wherein the pivot fastens to the body by a fastener.

33. The mounting bracket of claim 32, wherein the fastener is a screw.

34. The mounting bracket of claim 24, wherein the body is substantially planar.

35. The mounting bracket of claim 24, wherein the body further comprises a raised portion, the raised portion configured to engage the body to form a tight engagement between the pivot and the wall when the body is in the second position.

36. A mounting bracket for mounting a unit to a rack, comprising:

a body;

a mount coupled to a first side of the body, the mount configured to couple to the rack;

a pivot coupled by a fastener to a second side of the body, wherein the pivot is insertable into an aperture in a wall of the unit when the body is oriented in a first position and wherein, a portion of the pivot is positioned behind the wall to inhibit removal of the pivot from the unit when the body is rotated relative to the unit to a second position.

37. The mounting bracket of claim 36, wherein the body further comprises a raised portion, the raised portion configured to engage the unit to form a tight engagement between the pivot and the wall when the body is in the second position.

38. The mounting bracket of claim 36, further comprising a detent coupled to the body, the detent configured to limit a rotational range of motion of the mounting bracket with respect to the unit.

39. A mounting bracket for mounting a unit to a rack, the mounting bracket comprising planar means, mounting means on a first side of the planar means for attachment to a rack, pivot means on a second side of the planar means for being received within an aperture in a wall of the unit and for engaging behind the wall of the unit on rotation of the mounting bracket, and engagement means on the body for spacing the mounting bracket away from the unit to form a tight engagement between the unit and the mounting bracket.

40. A method of mounting a unit to a rack, comprising:

inserting a pivot of a first mounting bracket into a side of the unit;

rotating the first mounting bracket to couple the first mounting bracket to the unit;

positioning the mounting bracket away from the side by engagement of a protrusion of the mounting bracket with the side; and coupling the first mounting bracket to the rack.

41. The method of claim 40, further comprising, prior to coupling the mounting brackets to the rack, attaching each of first and second slide-shaped brackets to a rear support of the rack and sliding a rear of the rack-mountable unit into the slide-shaped brackets.

42. The method of claim 40, further comprising:

inserting a pivot of a second mounting bracket into a second side of the unit;

rotating the second mounting bracket to couple the second mounting bracket to the unit; and coupling the second mounting bracket to the rack.

43. The method of claim 42, wherein a direction of rotation of the first mounting bracket is different than a direction of rotation for the second mounting mounting bracket.

44. The method of claim 40, wherein a rotational range of the first mounting bracket is limited by a detent coupled to the first mounting bracket.

45. A method of mounting a unit within a rack, comprising:

inserting a pivot of a first mounting bracket into a side of the unit;

rotating the first mounting bracket to couple the first mounting bracket to the unit;

attaching a slide bracket to the rack;

coupling the unit to the slide bracket; and coupling the first mounting bracket to the rack.

* * * * *